(12) United States Patent
Bechtolsheim et al.

(10) Patent No.: US 10,841,246 B2
(45) Date of Patent: Nov. 17, 2020

(54) DISTRIBUTED CORE SWITCHING WITH ORTHOGONAL FABRIC CARD AND LINE CARDS

(71) Applicant: Arista Networks, Inc., Santa Clara, CA (US)

(72) Inventors: Andreas V. Bechtolsheim, Santa Clara, CA (US); Richard Hibbs, Hibbs, CA (US); Jiayi Wu, Santa Clara, CA (US); Warren Meggitt, Santa Clara, CA (US); Robert Wilcox, Santa Clara, CA (US); Alex Rose, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 15/691,599

(22) Filed: Aug. 30, 2017

(65) Prior Publication Data

US 2020/0195585 A1 Jun. 18, 2020

(51) Int. Cl.
*G06F 11/30* (2006.01)
*H04L 12/931* (2013.01)

(52) U.S. Cl.
CPC .................. *H04L 49/40* (2013.01)

(58) Field of Classification Search
CPC ........ H05K 7/04; H05K 7/20; H05K 7/20145; H05K 7/14; H05K 7/2019; G06F 1/20; G06F 1/16; H01R 12/72; H01R 12/00; H04L 49/15; H04Q 1/155; H04Q 1/15; F04D 29/584; F04D 29/522; F04D 29/563; F04D 29/325

USPC .................................................. 370/254, 364
See application file for complete search history.

(56) References Cited

U.S. PATENT DOCUMENTS

| | | |
|---|---|---|
| 3,715,629 A | 2/1973 | Swengel |
| 5,296,748 A | 3/1994 | Wicklund |
| 5,887,158 A | 3/1999 | Sample |
| 5,943,490 A | 8/1999 | Sample |
| 5,960,191 A | 9/1999 | Sample et al. |
| 6,163,464 A | 12/2000 | Ishibashi et al. |
| 6,168,469 B1 | 1/2001 | Lui |
| 6,466,008 B1 | 10/2002 | Fung et al. |
| 6,538,899 B1 | 3/2003 | Krishnamurthi et al. |
| 6,694,464 B1 | 2/2004 | Quayle et al. |
| 6,704,307 B1 | 3/2004 | Graves et al. |
| 6,757,748 B1 | 6/2004 | Hipp |
| 6,795,885 B1 | 9/2004 | deBlanc et al. |
| 6,932,649 B1 | 8/2005 | Rothermel et al. |

(Continued)

OTHER PUBLICATIONS

Related PCT Application PCT/US2018/047588, Written Opinion dated Dec. 6, 2018.

(Continued)

*Primary Examiner* — Man U Phan
(74) *Attorney, Agent, or Firm* — Fountainhead Law Group P.C.

(57) ABSTRACT

A network device is provided. The device includes a housing and a switch card, mounted within the housing and having one or more connectors. A plurality of line cards are oriented parallel to each other and orthogonal to the switch card and assembled to the one or more connectors of the switch card. The switch card has a chip, with a plurality of switches or routing paths, and the switch card and the chip couple to the plurality of line cards through the one or more connectors.

20 Claims, 5 Drawing Sheets

(56) References Cited

U.S. PATENT DOCUMENTS

| | | |
|---|---|---|
| 7,388,757 B2 | 6/2008 | Moakes et al. |
| 7,764,511 B2 | 7/2010 | Lee et al. |
| 7,885,066 B2 * | 2/2011 | Boyden .............. H05K 7/20563 312/236 |
| 7,929,310 B2 | 4/2011 | Belady et al. |
| 8,267,699 B2 * | 9/2012 | Li ........................ H05K 7/1445 439/61 |
| 8,500,454 B2 | 8/2013 | Hirano et al. |
| 8,579,636 B2 * | 11/2013 | Davis ................ H01R 12/7082 439/65 |
| 8,842,441 B2 * | 9/2014 | Bai ...................... H01R 12/737 361/728 |
| 8,861,222 B2 * | 10/2014 | Wen ................... H01R 12/7094 361/785 |
| 9,116,660 B1 * | 8/2015 | Widmann ................. G06F 1/20 |
| 9,136,624 B1 * | 9/2015 | Reynov .............. H01R 12/7082 |
| 9,362,641 B2 * | 6/2016 | Bachmutsky ........ H01R 12/737 |
| 9,794,195 B1 | 10/2017 | Wilson et al. |
| 9,888,605 B2 | 2/2018 | Xu et al. |
| 10,225,953 B2 | 3/2019 | Gernert |
| 2001/0046794 A1 | 11/2001 | Edholm |
| 2002/0046878 A1 | 4/2002 | Uzuka et al. |
| 2002/0182899 A1 | 12/2002 | Debord et al. |
| 2003/0200330 A1 | 10/2003 | Oelke et al. |
| 2004/0221106 A1 | 11/2004 | Perego et al. |
| 2005/0047098 A1 | 3/2005 | Garnett et al. |
| 2005/0207134 A1 | 9/2005 | Belady et al. |
| 2006/0073709 A1 | 4/2006 | Reid |
| 2006/0187634 A1 | 8/2006 | Tanaka et al. |
| 2006/0264085 A1 | 11/2006 | Kwatra et al. |
| 2008/0112133 A1 * | 5/2008 | Torudbakken ........... H04Q 1/04 361/694 |
| 2008/0112152 A1 | 5/2008 | Figueroa et al. |
| 2009/0009960 A1 * | 1/2009 | Melanson .......... H05K 7/20209 361/679.48 |
| 2009/0149041 A1 * | 6/2009 | Morlion ............. H01R 13/6585 439/65 |
| 2009/0216920 A1 | 8/2009 | Lauterbach et al. |
| 2010/0014248 A1 * | 1/2010 | Boyden .............. H05K 7/20563 361/695 |
| 2012/0120596 A1 * | 5/2012 | Bechtolsheim ........... G06F 1/20 361/679.48 |
| 2012/0294314 A1 | 11/2012 | Campbell et al. |
| 2013/0151745 A1 | 6/2013 | Yin et al. |
| 2013/0215563 A1 | 8/2013 | Behziz et al. |
| 2013/0337665 A1 | 12/2013 | Cohen et al. |
| 2014/0220795 A1 * | 8/2014 | Bai ...................... H01R 12/737 439/61 |
| 2014/0293998 A1 * | 10/2014 | Cheung ................... H04L 49/40 370/364 |
| 2015/0036280 A1 | 2/2015 | Gektin et al. |
| 2015/0186319 A1 | 7/2015 | Blevins et al. |
| 2015/0280827 A1 | 10/2015 | Adiletta et al. |
| 2015/0289406 A1 | 10/2015 | Coteus et al. |
| 2016/0183402 A1 | 6/2016 | Tamarakin et al. |
| 2017/0017052 A1 | 1/2017 | Costello |
| 2018/0359194 A1 | 12/2018 | Yang |
| 2019/0207342 A1 | 7/2019 | Aden et al. |
| 2019/0307014 A1 | 10/2019 | Adiletta et al. |
| 2020/0195583 A1 | 6/2020 | Ramalingam et al. |
| 2020/0195586 A1 | 6/2020 | Weaver |

OTHER PUBLICATIONS

PCT Application PCT/US2018/047588 filed Aug. 22, 2018, Written Opinion dated Dec. 6, 2018, 7 pages.

U.S. Appl. No. 16/381,077, filed Apr. 11, 2019 (unpublished), 41 pages.

U.S. Appl. No. 16/575,171, filed Sep. 18, 2019 (unpublished), 47 pages.

* cited by examiner

DISTRIBUTED CORE SWITCHING WITH ORTHOGONAL FABRIC CARD AND LINE CARDS

BACKGROUND

A network switch device typically has multiple line cards, and each line card can have multiple lines. Multiple switch cards each containing multiple switch circuits for connecting the line cards are common in such devices. Connector pin density and area on the cards (e.g., printed circuit boards) for connectors are limiting factors in packaging density for network devices. Obstructions for cooling airflow are also factors for design consideration. Often, a mid-plane solution is applied for connecting multiple switch cards to multiple line cards. However, the mid-plane obstructs airflow and can add to signal reflections and cost in a system. That ability to service and access the line and switch cards in a conventional network switch is inconvenient. For example, one problematic factor is the amount of insertion or removal force needed for removing a switch card connected to multiple line cards, for servicing or replacement of the switch card. Where each connector to a line card has 30 to 40 pounds of insertion/removal force, a switch card connected to four line cards would need approximately 120 to 160 pounds of force for insertion or removal. Therefore, there is a need in the art for a solution which overcomes the drawbacks described above.

SUMMARY

In some embodiments, a network device is provided. The device includes a housing and a switch card, mounted within the housing and having one or more connectors. A plurality of line cards are oriented parallel to each other and orthogonal to the switch card and assembled to the one or more connectors of the switch card. The switch card has a chip with a plurality of switches, and the switch card couples to the plurality of line cards through the one or more connectors.

In some embodiments, a network device is provided. The device includes a housing, dimensioned for rack mounting and a switch card, within the housing and having a plurality of switches, also referred to as switching paths or routing paths in a chip. The device includes one or more orthogonal direct connectors and a plurality of line cards coupled to the chip on the switch card through the one or more orthogonal direct connectors. Each of the plurality of line cards are parallel to each other of the plurality of line cards.

In some embodiments, a method of assembling or servicing a network device is provided. The method includes mounting a non-redundant switch card within a housing. The method includes assembling a plurality of line cards to one or more connectors of the switch card, with each of the plurality of line cards orthogonal to the switch card and parallel to each other of the plurality of line cards. The method includes coupling the plurality of line cards to a chip having a plurality of switches, also referred to as switching paths or routing paths, on the switch card, through the one or more connectors.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Various embodiments of a network switch device described herein have multiple line cards mounted orthogonal to and electrically coupled to a switch card, and solve multiple problems in packaging, connectivity, servicing and replacement of components, and deployment or configuration in a rackmount environment. One version has a midplane solution, and another version has an orthogonal direct connector solution, without a midplane.

Figure 1:
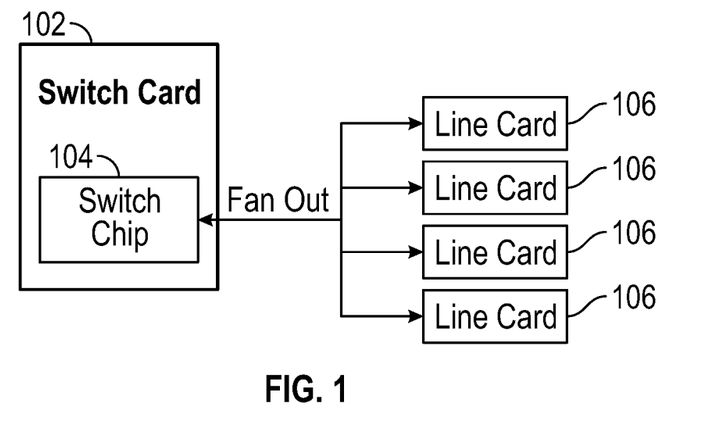
FIG. 1 is a block diagram of a switch card (or fabric card) with a switch chip, fanning out to multiple line cards, for a network switch device in accordance with some embodiments.

FIG. 1 is a block diagram of a switch card 102 (or fabric card) with a switch chip 104, fanning out to multiple line cards 106, for a network switch device. In this embodiment, rather than having multiple switch cards 102 and/or multiple switch chips 104, the network switch device has a single, non-redundant switch card 102 with a single (or multiple) switch chip 104 that has all of the switches for the network switch. The switches within switch chip 104 may be referred to as switching paths or routing paths. These switching paths or routing paths couple and/or connect ingress and egress ports of switch chip 104 through the switch fabric in some embodiments. One issue to address in the illustrated design is how to couple the switch chip 104 and all of the line cards 106 in a compact manner that does not obstruct airflow inside a housing. For example, if all of the line cards are arranged parallel to the switch card and along one edge of the switch card 102, e.g., with edge connectors, the switch card becomes unduly large as a result of the linear dimensions required for all of the interconnections. Other arrangements have related packaging issues because of the interconnections with the line cards. It should be appreciated that while a single switch chip is illustrated on the switch card, multiple switch chips may be integrated onto the switch card. It should be further appreciated that some of the embodiments provide a single switch card or fabric card as opposed to multiple switch cards or fabric cards of a device.

Figure 2:
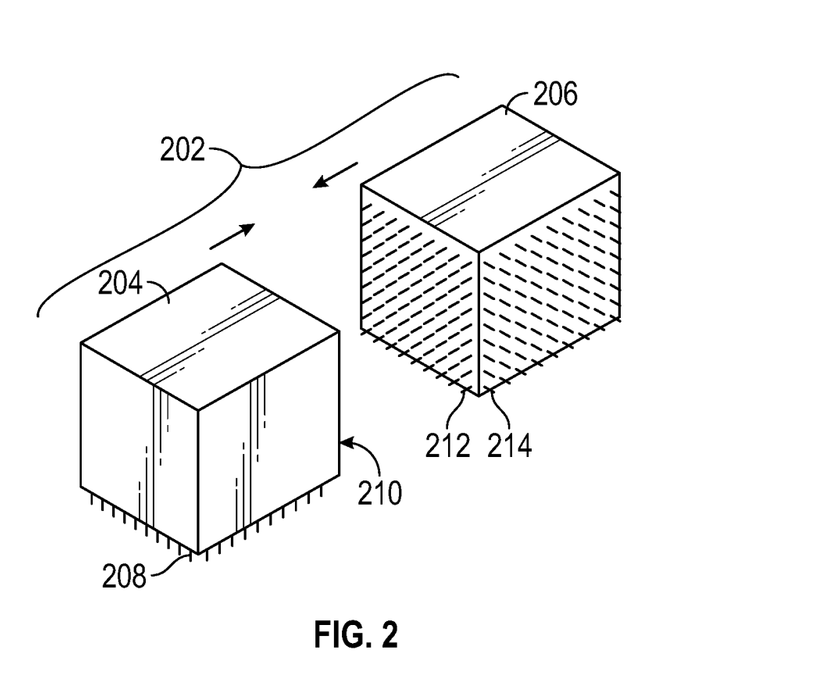
FIG. 2 is a perspective view of an orthogonal direct connector in accordance with some embodiments.

FIG. 2 is a perspective view of an orthogonal direct connector 202. Various orthogonal direct connectors are available from vendors, with various numbers of conductors, dimensions and relative orientations, and embodiments are not limited to the specific connectors shown herein. In this version, pins 212 of one connector 206 (e.g., a male connector) are inserted into sockets or pin receptacles of another connector 204 (e.g., a female connector), with solder pins 214 of the one connector 206 perpendicular or orthogonal to the solder pins 208 of the other connector 204. This mates the two connectors 204, 206 of the orthogonal direct connector 202. Orthogonal direct connectors may have a specific handedness or orientation of orthogonality (e.g., as keyed), or may have one connector rotatable with respect to the other connector. It should be appreciated that the mating or engagement of connectors 204 and 206 may utilize any suitable orientation that results in the orthogonal orientation discussed herein. When a printed circuit board or card is assembled to one connector 206 and another printed circuit board or card is assembled to the other connector 204, and the connectors 204, 206 are assembled to each other (i.e., mated) as the orthogonal direct connector 202, the two printed circuit boards or cards are orthogonal to each other as shown in FIG. 2. Note that two such printed circuit boards would meet each other edge to edge, with the edge of one printed circuit board adjacent and perpendicular to the edge of the other printed circuit board, rather than edge to face as is the case with orthogonal board connectors, e.g., that position one printed circuit board perpendicular and coupled to a central region of a face of another printed circuit board.

The term "connector" is understood to apply to a large variety of connectors with a large variety of numbers of conductors, and to groups of connectors, individual connectors, and components of a connector. For example, a male plug having one or more pins or prongs is considered a connector, a female socket having one or more pin or prong receptacles or socket contacts is considered a connector, and the combination of a male plug and female socket is a connector, as are hermaphrodite connectors and their components. Groups of multiple male connectors are considered a connector, as are groups of female connectors, and groups of hermaphrodite connectors. Connections to a connector can be made for example by crimping, soldering (pins or surface mount), or fastening, and can be made by wires, printed circuit board pads, plated through holes, edges or traces, or other connectors among various possibilities.

Figure 3:
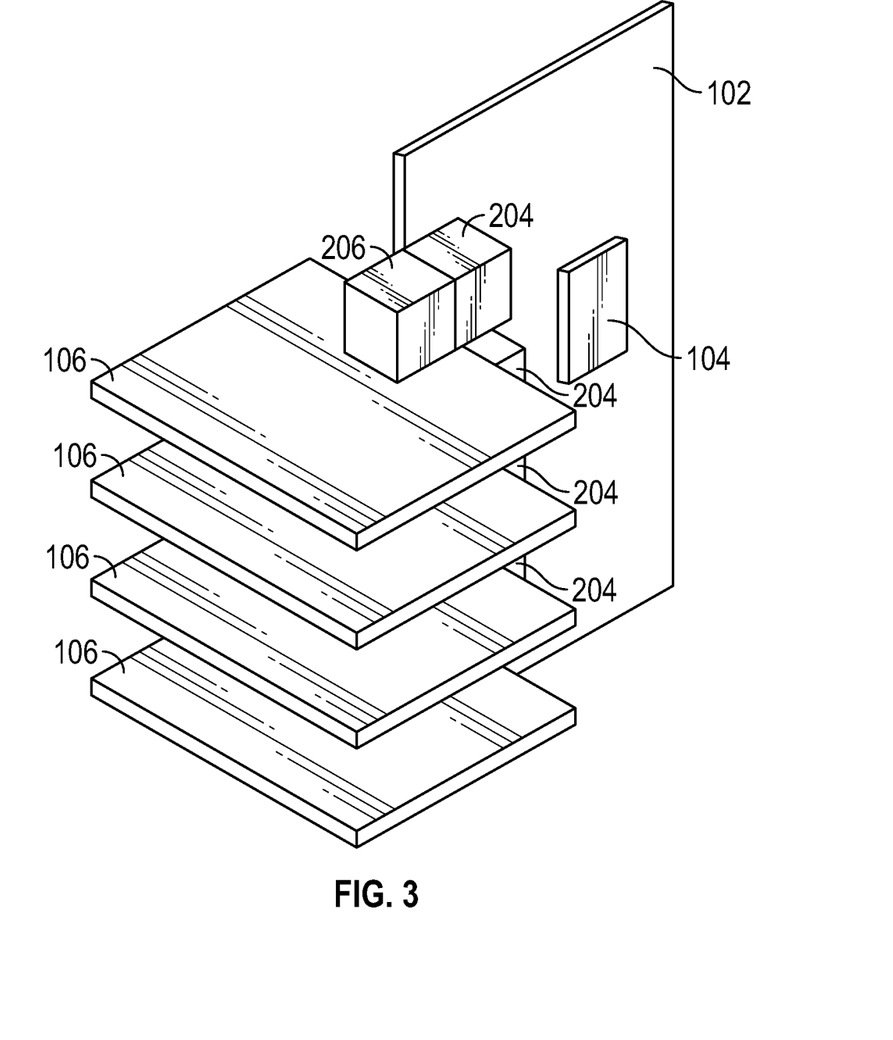
FIG. 3 is a perspective view of multiple line cards coupled through orthogonal direct connectors to a switch card, for a network switch device in accordance with some embodiments.

FIG. 3 is a perspective view of multiple line cards 106 coupled through orthogonal direct connectors 204, 206 (i.e., orthogonal direct connectors 202) to a switch card 102, for a network switch device. Circuits and signals of each line card 106 are coupled to the switch chip 104 through the connectors 204, 206, which orient the line cards 106 parallel to each other and orthogonal to the switch card 102. One edge of each line card 106 meets with (i.e., is adjacent to), and is perpendicular to, one edge of the switch card 102. In some embodiments, each connector 204, 206 is a single component, and in other embodiments, connectors 204 are combined into one connector, and/or connectors 206 are combined into one connector. Collectively, the combination of connectors 204, 206 in various embodiments can be viewed as a connector, or multiple connectors.

Figure 4:
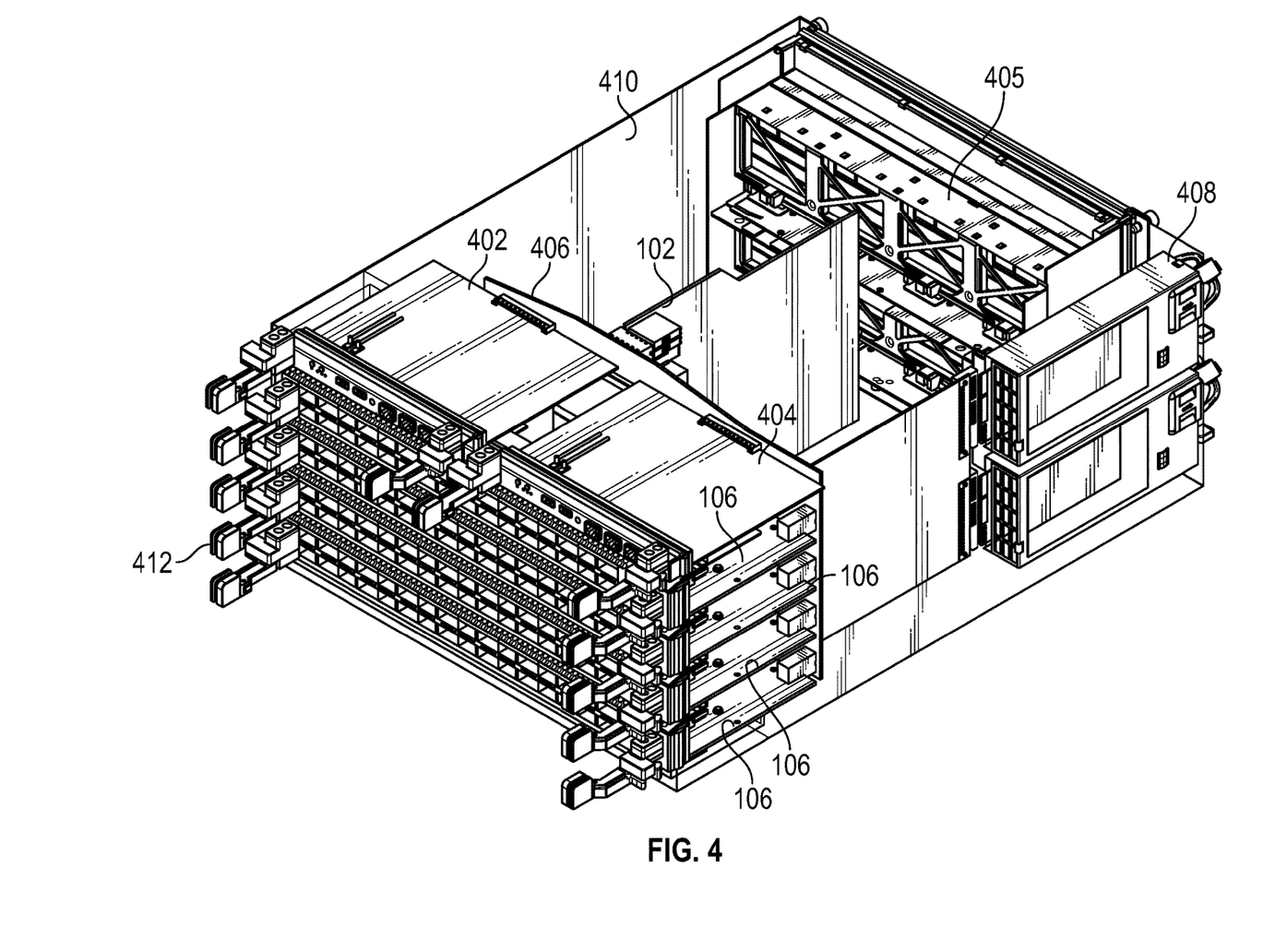
FIG. 4 is a perspective view of a network switch device with a housing, a switch card, and multiple line cards mounted orthogonal to the switch card and coupled to the switch card through connectors and a midplane in accordance with some embodiments.

FIG. 4 is a perspective view of a network switch device with a housing 410, a switch card 102, and multiple line cards 106 mounted orthogonal to the switch card 102 and coupled to the switch card 102 through connectors and a mid-plane 406. Various mid-plane connectors or edge connectors could be used to orient the line cards 106 parallel to each other and orthogonal to the switch card 102, with the mid-plane 406 perpendicular to one edge of the switch card 102 and perpendicular to one edge of each of the line cards 106. In this embodiment, further cards 402, 404, such as supervisor cards with processors thereupon, are mounted to the mid-plane 406, parallel to the line cards 406 and orthogonal or perpendicular to the switch card 102. The supervisor card and the processors mounted thereupon function to display switch component status and provide control for Ethernet management and console ports in some embodiments.

Some versions of the device of FIG. 4 have ejectors 412, for removal of line cards 106 and supervisor or other cards 402, 404. Each ejector 412 could be or include a lever, spring mounted or hinged and mounted to the housing 410. Various designs are possible. In one version, the switch card 102 has an ejector, and in another version the switch card 102 has no ejector. In another version, fan assemblies 405 at the opposite end of the housing from the line cards 106 are removable and replaceable. In yet another version, the fan assemblies 405 are removable, reversible and replaceable. Another version has the housing 410 dimensioned for reversibility in a rack, so that the network switch device can be pulled out of the rack, reversed relative to the rack, and reinserted into the rack facing the opposite direction. One version combines these features, so that the housing can be reversed relative to the rack, and the fans can be reversed relative to the housing. This preserves airflow relative to a hot aisle and a cold aisle on opposite sides of the rack. That is, airflow through the network switch device goes from the cold aisle to the hot aisle (warming up from cooling off components in the network switch device) in both, opposed orientations of the chassis and fan assemblies 405. Alternatively, the reversibility of the fan assemblies 405 is seen as a way of providing complete flexibility as to airflow direction, regardless of orientation of the housing 410 relative to a rack in which the housing 410 is rack mounted. Power supply units 408 are also removable and replaceable, in some versions.

Figure 5:
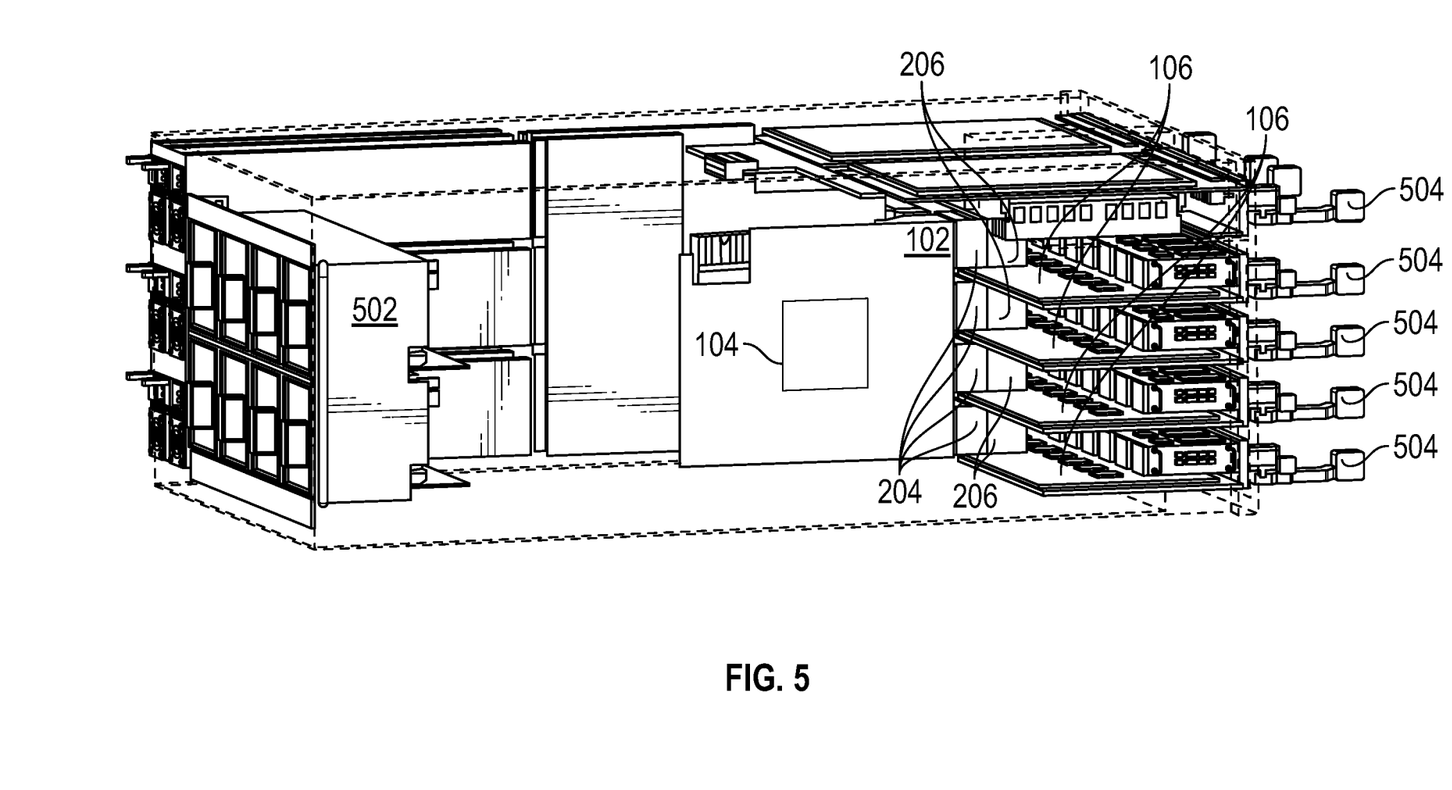
FIG. 5 is a perspective view of a network switch device with a housing, a switch card, and multiple line cards mounted orthogonal to the switch card and coupled to the switch card through orthogonal direct connectors in accordance with some embodiments.

FIG. 5 is a perspective view of a network switch device with a housing 506, a switch card 102, and multiple line cards 106 mounted orthogonal to the switch card 102 and coupled to the switch card 106 through orthogonal direct connectors 204, 206 (i.e., orthogonal direct connectors 202). Unlike the embodiment shown in FIG. 4, this network switch device lacks a mid-plane. Thus, the line cards 106 are coupled to the switch card 106 without passing signals and power connections through a mid-plane. This improves airflow through the housing 506, as there is no mid-plane to block airflow. This embodiment also provides for improvements to signal integrity.

Another improvement is in the solution to a problem of how to make the switch card 102 more easily insertable and removable without excessive force. For comparison, consider that in the embodiment shown in FIG. 4, sufficient force must be applied to the switch card 102 to overcome insertion and removal forces for the entire connector(s) that couple all of the signals from the switch card to the mid-plane 406 (and thus to the line cards 106 and optionally to the further circuit cards 402, 404). In the embodiment shown in FIG. 5, ejectors 504 are used to remove each of the line cards 106, and optionally any further circuit cards where present in various embodiments, from the couplings to the switch card 102. The switch card 102 is then readily removed, without need to overcome all of the force(s) for all of the connectors. In some embodiments, the switch card 102 is mounted internal to the housing 506, for example by fasteners, or a detent mechanism, on guide rails, etc. At assembly time, or when replacing (e.g., for testing, repairs or upgrade), the switch card 102 is inserted to the housing 506, secured in place, and afterwards the line cards 106 are inserted. Each line card 106, upon insertion or removal, experiences only the insertion or removal forces needed for that line card 106 relative to the switch card 102. At no time, if the above procedure is followed, does the switch card 102 experience insertion or removal forces of any or all of the line cards 106. It should be appreciated that the embodiments allow for ease of access to the switch card to enable non-redundancy since the switch card is so accessible. In addition, a single chip on the switch card has the ability to fan out to each of the line cards in some of the embodiments, allowing for a compact and efficient design.

In one version, the switch card 102 has an ejector. In another version, the switch card 102 has no ejector and is removable upon removal of fasteners or release of a detent mechanism. One embodiment has the switch card 102 slid on guide rails and mounted within the housing 506 with one or more fasteners or a detent mechanism, and contributing to the stiffness of the housing 506. Versions may have one or more supervisor or processor cards, related to those of FIG. 4. Similarly to the flexibility for the embodiments shown in FIG. 4, some embodiments of the network switch device shown in FIG. 5 have replaceable and/or reversible fan module(s) 502, or one or more individual fans that may be fixed or removable. Some embodiments have one or more replaceable power supplies (not shown in FIG. 5, but see FIG. 4). Ejectors 504 can be of various designs. Some versions feature reversibility of the housing relative to a rack, with or without reversibility of fan module(s).

Figure 6:
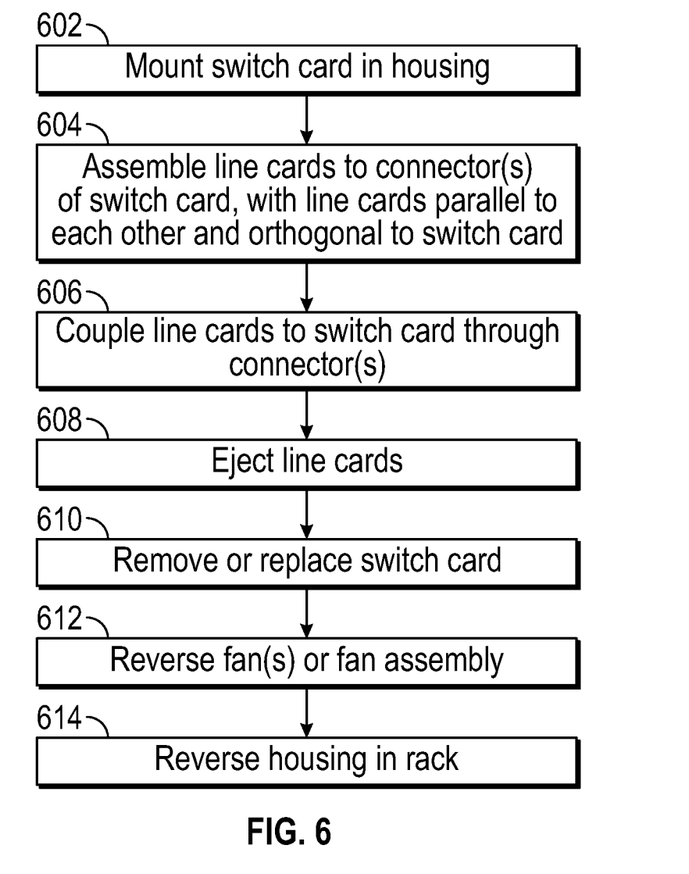
FIG. 6 is a flow diagram of a method of assembling or servicing a network switch device, which can be practiced with embodiments described herein.

FIG. 6 is a flow diagram of a method of assembling or servicing a network switch device, which can be practiced with embodiments described herein. It should be appreciated that the actions of the method in FIG. 6 can be performed in differing orders, groupings, or subsets than shown in FIG. 6, for various purposes or user preferences. In an action 602, a switch card is mounted in a housing. For example, the switch card could be slid on guide rails, and latched or fastened in place within the housing, prior to installation of line cards. In an action 604, line cards are assembled to one or more connectors of the switch card, with the line cards parallel to each other and orthogonal to the switch card. For example, one or more orthogonal direct connectors could be used to couple the line cards to the switch card. In an action 606, the line cards are electrically and mechanically coupled to the switch card through the connectors. These actions 602, 604, 606 can be used to assemble a network switch device, or install the same or replacement switch card and/or line cards, e.g., for servicing or upgrade.

In an action 608, line cards are ejected. In an action 610, the switch card is removed or replaced. These actions 608, 610 are followed in sequence, when removing or replacing the switch card, so that the switch card does not need force applied to overcome all of the removal force of the connectors to the line cards. In an action 612, one or more fans or fan assembly/assemblies are reversed, relative to the housing of the network switch device. This action 612 reverses cooling airflow through the housing. In an action 614, the housing is reversed in a rack. This action 614 could be used to make a front panel or back panel more accessible per user preference, or to reverse airflow relative to a rack. Further, the actions 612 and 614 can be combined to reverse orientation of the housing and front panel/back panel of the network switch device relative to a rack but preserve airflow direction relative to the rack and a hot aisle and cold aisle.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A network device, comprising:
a housing;
a switch card, having a chip with a plurality of switching paths within the chip, mounted within the housing and having one or more connectors, wherein the switch card is non-redundant and replaceable and is a sole switch card of the device;
a plurality of line cards oriented parallel to each other and orthogonal to the switch card, each line card of the plurality of line cards having a single direct connector directly assembled to a different single connector of the one or more connectors of the switch card without a midplane therebetween.

2. The network device of claim 1, further comprising:
one or more ejectors, arranged to eject each of the plurality of line cards, wherein the switch card has no ejector.

3. The network device of claim 1, further comprising:
one or more fasteners holding the switch card within the housing, wherein the one or more fasteners and the switch card contribute to stiffness of the housing.

4. The network device of claim 1, further comprising:
one or more removable, reversible fans assembled to or in the housing.

5. The network device of claim 1, wherein the housing is dimensioned for reversibility in a rack mounting.

6. The network device of claim 1, further comprising:
one or more processor cards, orthogonal to the switch card and assembled to the one or more connectors of the switch card.

7. A network device, comprising:
a housing, dimensioned for rack mounting;
a switch card, within the housing and having a plurality of routing paths within a chip, wherein the switch card is non-redundant, singular and replaceable and is removable;
one or more orthogonal direct connectors; and
a plurality of line cards coupled to the chip on the switch card through the one or more orthogonal direct connectors, each of the plurality of line cards parallel to each other of the plurality of lines cards, each of the plurality of line cards directly assembled to the switch card, by a different single orthogonal direct connector of the one or more orthogonal direct connectors, without using a midplane.

8. The network device of claim 7, further comprising:
the housing having a plurality of ejectors to eject the plurality of line cards.

9. The network device of claim 7, wherein:
the switch card is fastened or securable within the housing and has no ejector; and
the fastened or secured switch card adds to stiffness of the housing.

10. The network device of claim 7, further comprising:
one or more fan modules attached to or inserted in the housing, wherein each of the one or more fan modules is removable and reversible.

11. The network device of claim 7, further comprising:
the housing being reversible relative to the rack mounting.

12. A method of assembling or servicing a network device, comprising:
mounting a non-redundant switch card, having one or more orthogonal direct connectors, within a housing, wherein the switch card is non-redundant and replaceable and is a sole switch card of the device;
directly assembling each line card of a plurality of line cards to the switch card, using a different single orthogonal direct connector of the one or more orthogonal direct connectors of the switch card, without using a midplane, with each of the plurality of line cards orthogonal to the switch card and parallel to each other of the plurality of line cards; and
coupling the plurality of line cards to a chip having a plurality of switching paths within the chip, the chip mounted on the switch card.

13. The method of claim 12, further comprising:
replacing the switch card with a further switch card.

14. The method of claim 12, further comprising:
ejecting one or more of the plurality of line cards, using one or more ejectors that are attacked to the housing, wherein the housing has no ejector for the switch card.

15. The method of claim 12, wherein the mounting the switch card comprises fastening the switch card within the housing, using one or more fasteners.

16. The method of claim 12, further comprising:
removing one or more fans or fan assemblies from the housing;
reversing the one or more fans or fan assemblies relative to the housing; and
re-installing the one or more fans or fan assemblies, reversed, into the housing.

17. The method of claim 12, further comprising:
removing the housing from a rack;
reversing the housing, relative to the rack; and
re-installing the housing into the rack.

18. The method of claim 12, further comprising:
assembling one or more processor cards to the one or more connectors of the switch card, with each of the one or more processor cards orthogonal to the switch card, wherein the chip is a sole chip of the switch card.

19. The network device of claim 1, wherein each of the plurality of line cards are coupled to the switch card without passing signals or power connections through a midplane.

20. The network device of claim 1, wherein single direct connector of a particular line card is configured to be removeable from the corresponding connector of the switch card by a removal force for that particular line card and not by removal forces for other line cards of the plurality of line cards.

\* \* \* \* \*